United States Patent [19]
Yoshioka et al.

[11] Patent Number: 5,297,910
[45] Date of Patent: Mar. 29, 1994

[54] TRANSPORTATION-TRANSFER DEVICE FOR AN OBJECT OF TREATMENT

[75] Inventors: Kazutoshi Yoshioka, Kamoto; Kenji Yokomizo; Masami Akimoto, both of Kumamoto; Yuji Yoshimoto, Kikuchi, all of Japan

[73] Assignees: Tokyo Electron Limited, Tokyo; Tokyo Electron Kyushu Limited, Kumamoto, both of Japan

[21] Appl. No.: 834,819

[22] Filed: Feb. 13, 1992

[30] Foreign Application Priority Data

Feb. 15, 1991 [JP] Japan ............................. 3-44403
Sep. 17, 1991 [JP] Japan ............................. 3-262621
Nov. 19, 1991 [JP] Japan ............................. 3-330041

[51] Int. Cl.$^5$ ............................................. B65H 5/08
[52] U.S. Cl. ............................... 414/225; 414/416; 414/751; 414/935; 414/937
[58] Field of Search .............. 414/225, 331, 404, 416, 414/751, DIG. 1, DIG. 3, 935, 937; 901/33; 228/59

[56] References Cited

U.S. PATENT DOCUMENTS

| | | | |
|---|---|---|---|
| 4,319,864 | 3/1982 | Kaufeldt | 414/751 |
| 4,709,342 | 11/1987 | Hosoda et al. | 901/33 |
| 4,775,281 | 10/1988 | Prentakis | |
| 4,923,352 | 5/1990 | Tamura et al. | 414/225 |
| 4,985,722 | 1/1991 | Ushijima et al. | |

*Primary Examiner*—Michael S. Huppert
*Assistant Examiner*—Donald W. Underwood
*Attorney, Agent, or Firm*—Oblon, Spivak, McClelland, Maier & Neustadt

[57] ABSTRACT

A device for transporting and transferring objects of treatment arranged in a down flow to a plurality of treatment sections for treating the objects comprises a transportation section movable between the treatment sections, a first drive mechanism for moving the transportation section, a first arm movably attached to the transportation section and used for those objects of treatment which are adjusted to a predetermined temperature in the treatment sections, a second arm movably attached to the transportation section and used for the other objects of treatment than the ones adjusted in temperature, and a second drive mechanism for separately moving the first and second arms.

10 Claims, 7 Drawing Sheets

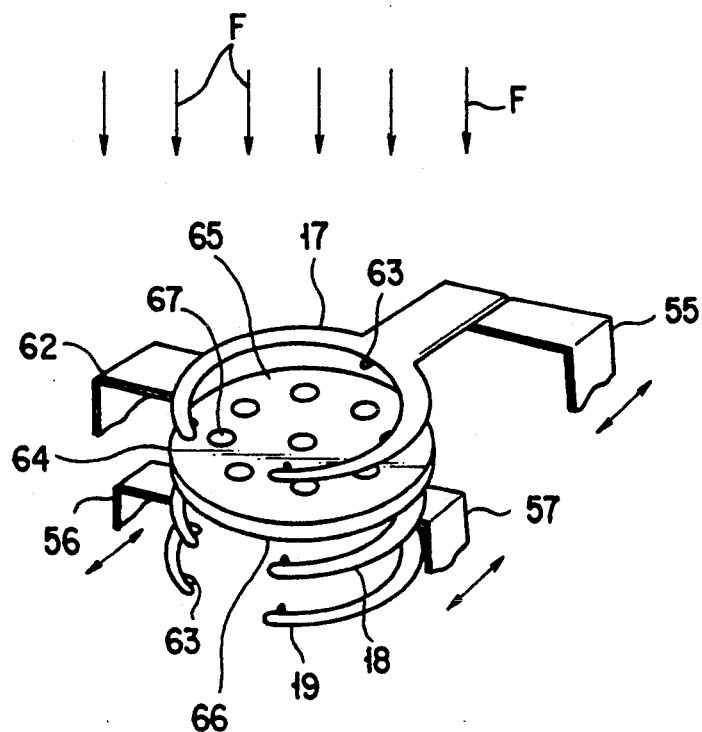
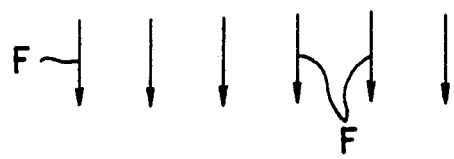
F I G. 5
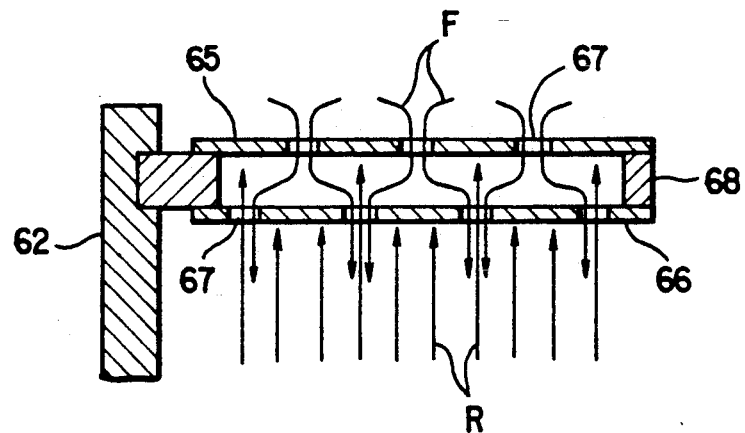
F I G. 6

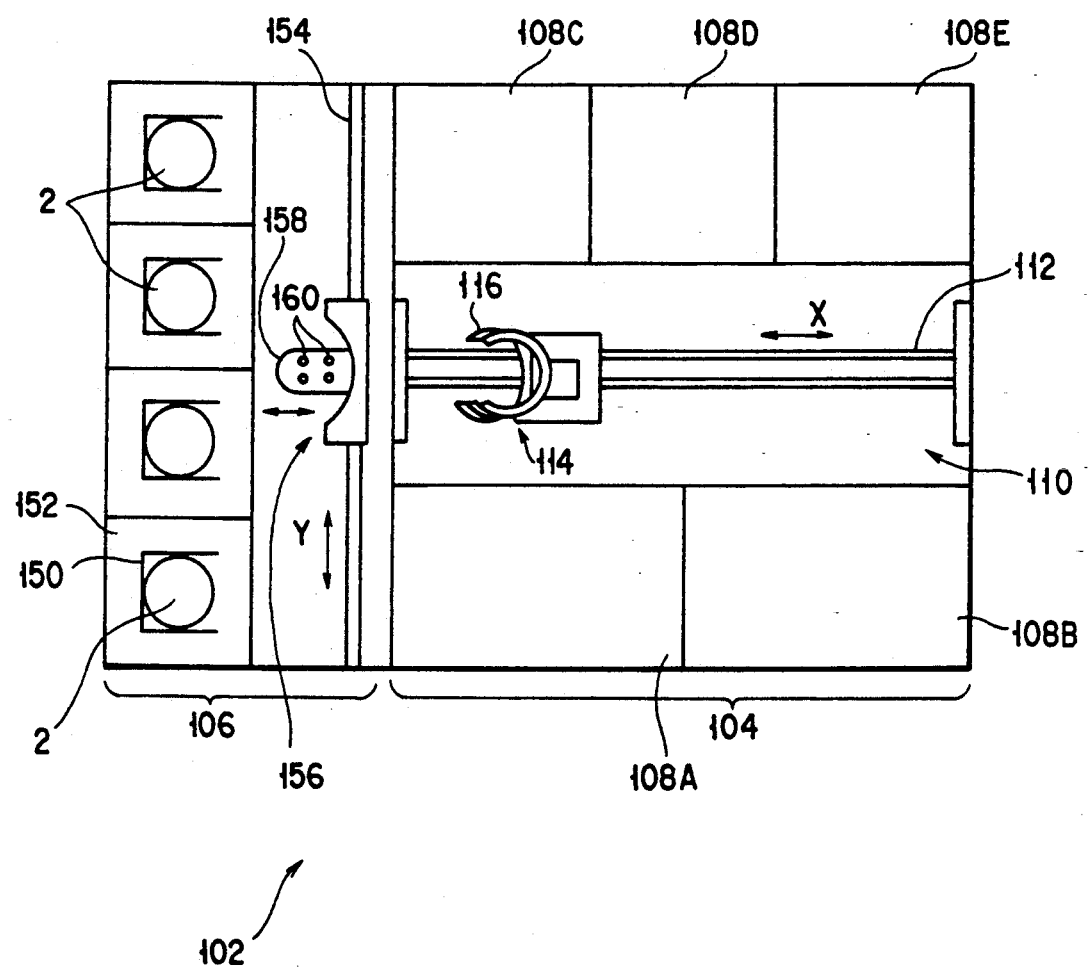
F I G. 8

TRANSPORTATION-TRANSFER DEVICE FOR AN OBJECT OF TREATMENT

BACKGROUND OF THE INVENTION

1. Field of the Invention

The present invention relates to a transportation-transfer device for an object of treatment used in, for example, a semiconductor manufacturing apparatus, and more particularly, to a semiconductor wafer transfer device of a resist film forming apparatus.

2. Description of the Related Art

Conventionally known are semiconductor wafer treatment apparatuses which comprise a plurality of semiconductor wafer treatment mechanisms and a delivery mechanism for carrying semiconductor wafers into and out of the treatment mechanisms. These apparatuses, which are disclosed in, for example, U.S. Pat. Nos. 4,775,281 and 4,985,722, are applied to resist film forming apparatuses, developing apparatuses, etc.

In a resist film forming apparatus disclosed in U.S. Pat. No. 4,985,722, two forks are arranged for movement from side to side along a transportation path, and wafer carriers loaded with semiconductor wafers without resist film thereon and wafer carriers for storing semiconductor wafers with resist film formed thereon are arranged on one side of the transportation path. A cooling mechanism, applicator mechanism, and baking mechanism are arranged on the other side of the transportation path. The cooling mechanism serves to adjust the wafers transported from the wafer carriers to a predetermined temperature. The applicator mechanism is used to apply the resist film to the wafers delivered from the cooling mechanism. In the baking mechanism, the semiconductor wafers coated with the resist film by means of the applicator mechanism are subjected to heat treatment.

Each of the two forks has a holding section, e.g., vacuum suction means, for holding each semiconductor wafer. Also, each fork is provided with a mechanism for moving the holding section to each wafer carrier and the position of each treatment mechanism in which the wafers are placed. In this arrangement, the semiconductor wafers can be successively delivered from the wafer carriers to the treatment mechanisms, and finally stored in the carriers.

While one semiconductor wafer is being carried out from one of the treatment mechanism, in the above-described apparatus having the two forks, another wafer to be treated next can be carried into the same treatment mechanism to be set therein. Accordingly, the time required for a treatment process can be shortened.

Since the semiconductor wafers are transported by moving the forks along the transportation path in the aforesaid manner, moreover, only one transportation mechanism can accomplish the transportation of the wafers between a plurality of treatment mechanisms. Thus, the apparatus can be reduced in size.

If the single transportation mechanism is bound to manage the wafer transportation between the treatment mechanisms, however, the temperature of each fork is increased by heat from each semiconductor wafer as the wafer is transported from the baking mechanism to one of the wafer carriers. When the semiconductor wafer to be treated next is transported from the cooling mechanism to the applicator mechanism, therefore, it is heated by the fork, so that the wafer temperature is inevitably deviated from the temperature set by means of the cooling mechanism.

When one of the two forks of the transportation mechanism increases, its heat is transmitted through ambient gas to the other fork. Even in the case where a semiconductor wafer is transported from the cooling mechanism to the applicator mechanism by means of that fork which does not engage in the transportation of the wafer from the baking mechanism to the wafer carrier, therefore, the newly transported wafer is undesirably heated in the same manner as aforesaid.

These problems are not limited to the case where the transportation-transfer device is applied to the resist film forming apparatus, and also arise when the device is applied to any other apparatus, such as a developing apparatus.

SUMMARY OF THE INVENTION

The object of the present invention is to provide a transportation-transfer device capable of transporting objects of treatment, such as semiconductor wafers, once adjusted in temperature, between treatment sections without varying the temperature of each object.

According to the present invention, there is provided a device for transporting and transferring objects to be treated arranged in a down flow to a plurality of treatment sections for treating the objects, which comprises: a transportation section movable between the treatment sections; first drive means for moving the transportation section; a first arm movably attached to the transportation section and used for those objects to be treated which are adjusted to a predetermined temperature in the treatment sections; a second arm movably attached to the transportation section and used for the other objects to be treated than the ones adjusted in temperature; and second drive means for separately moving the first and second arms.

According to the present invention, the transportation section for the objects of treatment, such as semiconductor wafers, is provided with the first and second arms, and the objects of treatment are transported by means of these arms and the drive means. The second arm is used to carry out the objects of treatment from the high-temperature treatment sections, while the first arm is used to transport those objects of treatment whose temperatures are not high and are not expected to be varied.

Since the two arms are thus used properly, those objects of treatment whose temperatures should not be varied cannot be transported by means of the arm whose temperature is raised by the transportation of the high-temperature objects. Thus, the temperature-controlled objects of treatment can be transported with their respective temperatures maintained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above

FIG. 5 is a perspective view of an arm section according to the modification shown in FIG. 4;

FIG. 6 is a sectional view of a heat insulation member shown in FIG. 5;

FIG. 8 is a schematic plan view of a transportation-transfer device according to a second embodiment of the invention;

DETAILED DESCRIPTION OF THE PREFERRED EMBODIMENTS

Preferred embodiments of the present invention will now be described with reference to the accompanying drawings.

Figure 1:
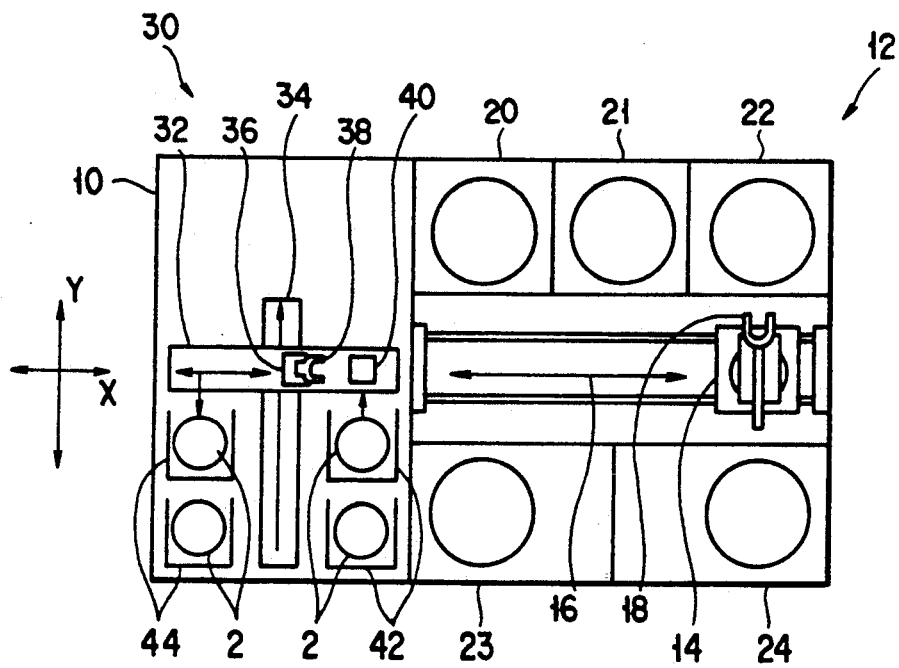
FIG. 1 is a schematic plan view of a transportation-transfer device according to a first embodiment of the present invention.
Figure 2:
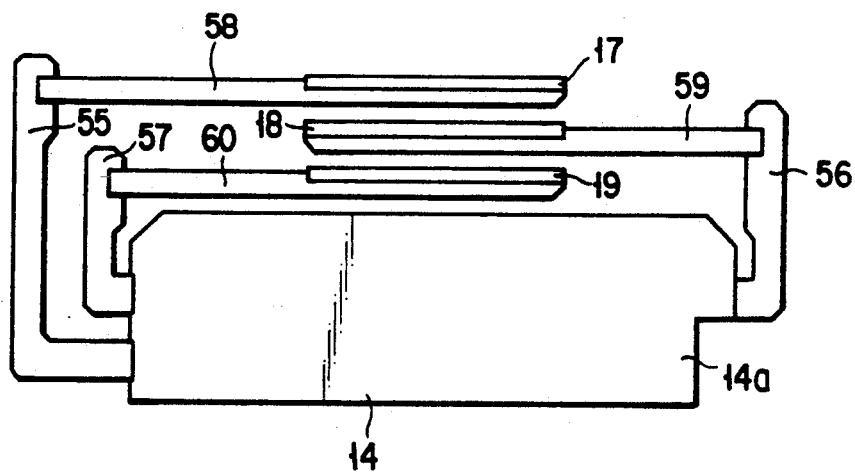
FIG. 2 is a schematic side view of a transportation mechanism shown in FIG. 1.
Figure 3:
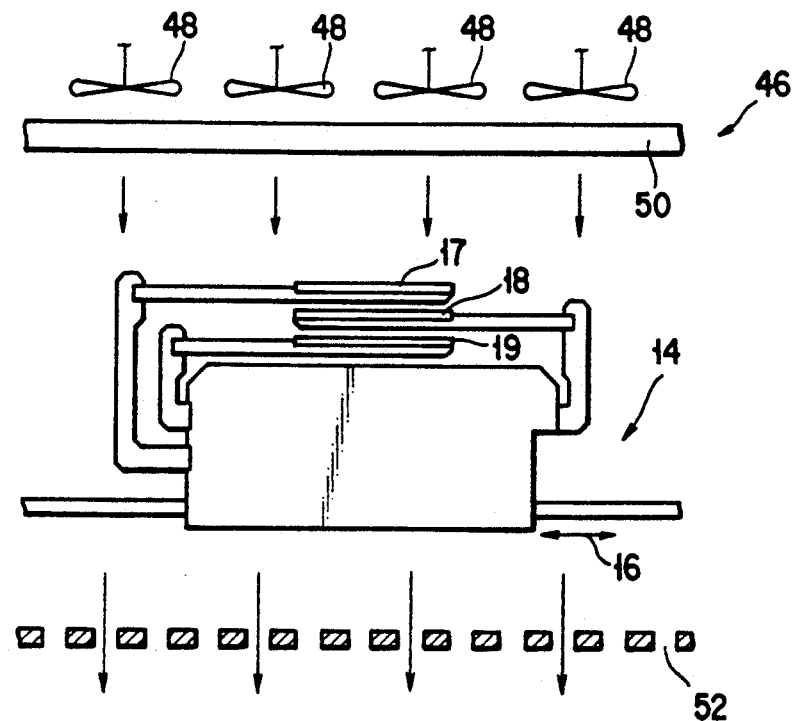
FIG. 3 is a schematic side view showing the relationship between the transportation mechanism and a down flow in a clean room.

FIGS. 1 to 3 show a resist film forming apparatus which is provided with a transportation-transfer device according to a first embodiment of the present invention.

As shown in FIG. 1, a body 10 of the resist film forming apparatus includes a treatment mechanism unit 12 and a delivery mechanism 30.

The delivery mechanism 30 serves to take out untreated semiconductor wafers 2 stored in wafer carriers 42 and place them on a table 40, and to load wafer carriers 44 with the treated wafers 2 on the table 40. The mechanism 30 comprises a fork 38 for attractingly holding the wafers 2, an X-direction movement mechanism 32 for moving the fork 38 in the X direction, a Y-direction movement mechanism 34 for moving the fork 38 in the Y direction, and a θ-direction movement mechanism 36 for rotating the fork 38 in the θ direction. Further, the delivery mechanism 30 comprises a lift mechanism (not shown) for moving the carriers 42 and 44 in the Z direction (vertical direction).

The treatment mechanism unit 12 comprises treatment mechanisms or treatment sections 20 to 24 for subjecting the semiconductor wafers 2 to various treatments, and a transportation mechanism or transportation section 14 for delivering the semiconductor wafers 2 to and from the treatment mechanisms 20 to 24. The resist film forming apparatus is installed in a clean room with down flow ambient gas therein, in which clean air flows downward.

FIG. 2 shows the principal part of the transportation mechanism 14.

The transportation mechanism 14 includes a transportation base 14a, support shafts 55, 56 and 57 on the base 14a, and three forks 17, 18 and 19 supported on the shafts 55, 56 and 57 by means of arm portions 58, 59 and 60, respectively. The forks 17, 18 and 19 are arranged extending in the Y (transverse) direction over the transportation base 14a. In this arrangement, the forks 17, 18 and 19 are moved in the X (longitudinal) direction along a transportation path 16.

The forks 17, 18 and 19 are also moved independently in the Y (transverse) direction, Z (vertical) direction, and θ (rotating) direction by using moving means (not shown). The moving means is composed of, for example, stepping motors attached to the transportation mechanism 14 and rotary drive mechanisms (not shown), such as ball screws, connected thereto.

The three forks 17, 18 and 19, which are provided for holding the semiconductor wafers 2, include a holding mechanism (not shown) each. The holding mechanism may be of an electrostatic chuck type or a type such that the lower surface of the peripheral portion of each semiconductor wafer 2 is supported by means of a plurality of claws.

The fork (first arm) 17, which is located higher than the other forks 18 and 19, is used only in transporting the semiconductor wafers 2 from a cooling mechanism 22 (mentioned later) to a first or second applicator mechanism 23 or 24. The fork 18 and the fork (second arm) 19, which are located under the fork 17, are used for other transportation strokes than the stroke of transportation of the the wafers 2 from the cooling mechanism 22 to the first or second applicator mechanism 23 or 24. Thus, in the present embodiment, the forks are properly used depending on the transportation stroke.

In the resist film forming apparatus of the present embodiment, the fork 17, which is used only in transporting the semiconductor wafers 2 from the cooling mechanism 22 to the first or second applicator mechanism 23 or 24, is located over the other forks 18 and 19 (or on the upper-course side of the forks 18 and 19 with respect to an ambient gas flow produced by a down flow mechanism 46), as shown in FIG. 3. Thus, when the fork 18 or 19 is heated in carrying out the semiconductor wafers 2 from a baking mechanism 21 (mentioned later), its heat is prevented from being transferred to the fork 17 by means of the ambient gas.

The heat transfer to the fork 17 can be prevented without necessarily causing the ambient gas to flow downward, and by only locating the fork 17 on the upper-course side, with respect to the ambient gas flow produced by the down flow mechanism 46, and the forks 18 and 19 on the lower-course side. In order to minimize dust in the resist film forming apparatus, however, it is advisable to cause the ambient gas to flow downward.

In the resist film forming apparatus of the present embodiment, the semiconductor wafers 2, previously set on the table 40, are repeatedly delivered in succession into and from the treatment sections 20 to 24 by means of the transportation mechanism 14 described above. After they are subjected to various treatments, the wafers 2 are set again on the table 40.

The following is a description of the treatment sections 20 to 24. The adhesion treatment mechanism 20, baking mechanism 21, cooling mechanism 22, and first and second applicator mechanisms 23 and 24 are arranged along the transportation path 16 of the transportation mechanism 14 on either side thereof.

In the adhesion treatment mechanism 20, an adhesion treatment is carried out to improve the adhesion between each semiconductor wafer 2 and a resist film.

In the baking mechanism 21, the semiconductor wafer 2, having the resist film thereon, is subjected to a heat treatment. This heat treatment is carried out to evaporate a solvent remaining in the resist film applied to the semiconductor wafer 2. Since the heat treatment in the baking mechanism 21 takes a long time, it is advisable to arrange the mechanism so that a plurality of semiconductor wafers 2 can be simultaneously heat-treated.

In the cooling mechanism 22, the semiconductor wafer 2 is cooled to a predetermined temperature (23° C. in the present embodiment) before the resist film is formed thereon by means of the first and second applicator mechanisms 23 and 24. It is in order to control the thickness of the resist film to be formed with high accuracy that the wafer temperature is adjusted to the predetermined value before the formation of the resist film.

In the first and second applicator mechanisms 23 and 24, the resist film is formed on the upper surface of each semiconductor wafer 2. The two applicator mechanisms are provided because the time required for the formation of the resist film is much longer than the time required for the treatments in the other treatment mechanisms 20 to 22.

The following is a description of processes for forming a photoresist film on the surface of each semiconductor wafer 2 in the aforementioned resist film forming apparatus.

First, the X-, Y-, and θ-direction movement mechanisms 32, 34 and 36 of the delivery mechanism 30 are driven to move the fork 38 to the position under the wafer carrier 42 stored with the untreated semiconductor wafers 2.

Subsequently, the wafer carrier 42 is lowered by means of the lift mechanism (not shown) of the delivery mechanism 30, and one of the untreated semiconductor wafers 2 in the carrier 42 is transferred to the fork 38, and attractingly held by means of the fork 38.

Then, the fork 38 is moved in the X direction to carry out the semiconductor wafer 2 thereon from the wafer carrier 42, and also moved in the Y direction to place the wafer on the table 40.

The transportation mechanism 14 of the treatment mechanism unit 12 is moved to the left of FIG. 1 (in the X direction), and the semiconductor wafer 2 on the table 40 of the delivery mechanism 30 is attractingly held by means of the fork 18 (or 19).

Subsequently, the transportation mechanism 14 is moved to the adhesion treatment mechanism 20, and the semiconductor wafer 2 held by means of the fork 18 set in the adhesion treatment mechanism 20, whereupon it is subjected to the adhesion treatment. The adhesion treatment is carried out to improve the adhesion between each semiconductor wafer 2 and the resist film to be formed later.

During this treatment, the delivery mechanism 30 is operated so that the semiconductor wafer 2 to be treated next (hereinafter referred to as second semiconductor wafer 2) is taken out of the wafer carrier 42 and placed on the table 40. Further, the wafer 2 is attractingly held by means of the fork 18, and the fork 18 is moved to the adhesion treatment mechanism 20.

When the adhesion treatment is finished, the transportation mechanism 14 is moved, and the adhesion-treated semiconductor wafer 2 (hereinafter referred to as first semiconductor wafer 2) is taken out of the treatment mechanism 20 by means of the fork 19. Subsequently, the second semiconductor wafer 2 attractingly held by means of the fork 18 is set in the adhesion treatment mechanism 20.

Thus, in the resist film forming apparatus of the present embodiment, the second semiconductor wafer 2 is transported by utilizing the time during which the first semiconductor wafer 2 is treated by means of the adhesion treatment mechanism 20. The moment the first semiconductor wafer 2 is taken out of the treatment mechanism 20, moreover, the second semiconductor wafer 2 is set in the mechanism 20. This arrangement can ensure an improved throughput. This can be attained because the resist film forming apparatus of the present embodiment is provided with the two forks 18 and 19 for the other transportation strokes than the stroke of transportation of the the wafers from the cooling mechanism 22 to the first or second applicator mechanism 23 or 24.

Then, the first semiconductor wafer 2, attractingly held by means of the fork 19 in the aforesaid manner, is moved by means of the transportation mechanism 14, and set in the cooling mechanism 22. In the mechanism 22, the semiconductor wafer 2 is cooled and adjusted to a temperature of 23° C. While the first semiconductor wafer 2 is being treated in the cooling mechanism 22, the delivery mechanism 30 is operated so that the second semiconductor wafer 2, treated by means of the adhesion treatment mechanism 20, is attractingly held by means of the fork 18, and the fork 18 is moved to the inlet of the cooling mechanism 22. When cooling the first semiconductor wafer 2 ends, this wafer 2 is attractingly held and taken out of the cooling mechanism 22. Then, the second semiconductor wafer 2, attractingly held by means of the fork 18, is set in the cooling mechanism 22.

The adhesion treatment may be started after setting a third semiconductor wafer 2 in the adhesion treatment mechanism 20 while treating the first semiconductor wafer 2 in the cooling mechanism 22. The efficiency of the treatment process can be further improved by treating the third semiconductor wafer 2 and its subsequent ones in parallel.

Then, the first semiconductor wafer 2, attractingly held by means of the fork 17, is transported to the first or second applicator mechanism 23 or 24. Thus, according to the present embodiment, the two applicator mechanisms can be used in parallel with each other, so that the efficiency of the treatment process can be improved. In this case, the first wafer 2 is transported to the first applicator mechanism 23.

Subsequently, the photoresist film is formed on the first semiconductor wafer 2 by means of the first applicator mechanism 23. In the meantime, the transportation mechanism 14 carries out the second semiconductor wafer 2, treated in the cooling mechanism 22, from the mechanism 22 in a manner such that the wafer 2 is attractingly held by means of the fork 17, and sets the wafer 2 in the second applicator mechanism 24. In like manner, the photoresist film is formed on the third semiconductor wafer 2 and its subsequent ones by means of the first or second applicator mechanism 23 or 24.

After the photoresist film is thus formed by means of the first or second applicator mechanism 23 or 24, the semiconductor wafers 2 are successively attractingly held by means of the fork 18 (or 19), transported by means of the transportation mechanism 14, and set again in the baking mechanism 21.

Then, the heat treatment is carried out by means of the baking mechanism 21 to evaporate the solvent remaining in the resist film applied to the semiconductor wafers 2.

Each heat-treated semiconductor wafer 2 is attractingly held by means of the fork 18 (or 19), and is placed on the table 40 by moving the transportation mechanism 14. If the wafer 2 on the table 40 is an untreated one, it is received in advance from the table 40 by means of the fork 18 (or 19).

Finally, the semiconductor wafers 2 on the table 40 are transported held by means of the fork 38 of the delivery mechanism 30, and the treated wafers 2 are loaded into the wafer carriers 44.

Thus, according to the resist film forming apparatus of the present embodiment, the different forks are properly used for the transportation of the semiconductor wafers 2 from the cooling mechanism 22 to the first or second applicator mechanism 23 or 24 and for the other transportation processes. Moreover, the fork 17 used for the transportation of the wafers 2 from the cooling mechanism 22 to the first or second applicator mechanism 23 or 24 is located above the other ones. Accordingly, the temperature of the semiconductor wafers 2 can be prevented from increasing when the wafers 2 are transported from the cooling mechanism 22 to the first or second applicator mechanism 23 or 24.

In carrying out the semiconductor wafers 2 from the cooling mechanism 22, the fork 17 is exclusively used, and the other forks 18 and 19 for transporting the heat-treated wafers 2 are not used, so that the temperature of the wafers 2 cannot be increased by any heat accumulated in the forks.

Since the fork 17 is located at the top, moreover, heat cannot be easily transferred from the lower-course side to the upper-course side, with respect to the down flow of the ambient gas, even though the heat-treated semiconductor wafers 2 are simultaneously transported by means of the lower fork 18 or 19. Thus, the temperature of the semiconductor wafers 2 being transported by means of the fork 17 can be prevented from increasing.

The down flow is not limited to the one produced in the clean room in which the treatment apparatus is installed. As shown in FIG. 3, for example, a down flow of clean air from above the transportation mechanism 14 may be formed by means of a down flow mechanism 46, which comprises fans 48 for producing ambient gas streams, a filter 50 for removing dust in the ambient gas, and air suction ports 52 through which the ambient gas streams passed through the filter 50 are discharged.

Referring now to FIGS. 4 to 7, a modification of the first embodiment of the present invention will be described.

In this modification, as shown in FIG. 5, for example, each of the forks 17, 18 and 19 is provided, at its distal end portion, with a support frame in the form of a cut ring which resembles the external form of each wafer 2. The support frame is formed having a plurality of receiving members or claws 63 which are adapted to engage the lower surface of the peripheral portion of the wafer 2 and partially support the wafer 2 at least at three points. Preferably, the claws 63 are formed of an adiabatic material, e.g., fluoroplastics. A vacuum suction arm or electrostatic chuck may be used as a wafer holding mechanism.

Figure 7:
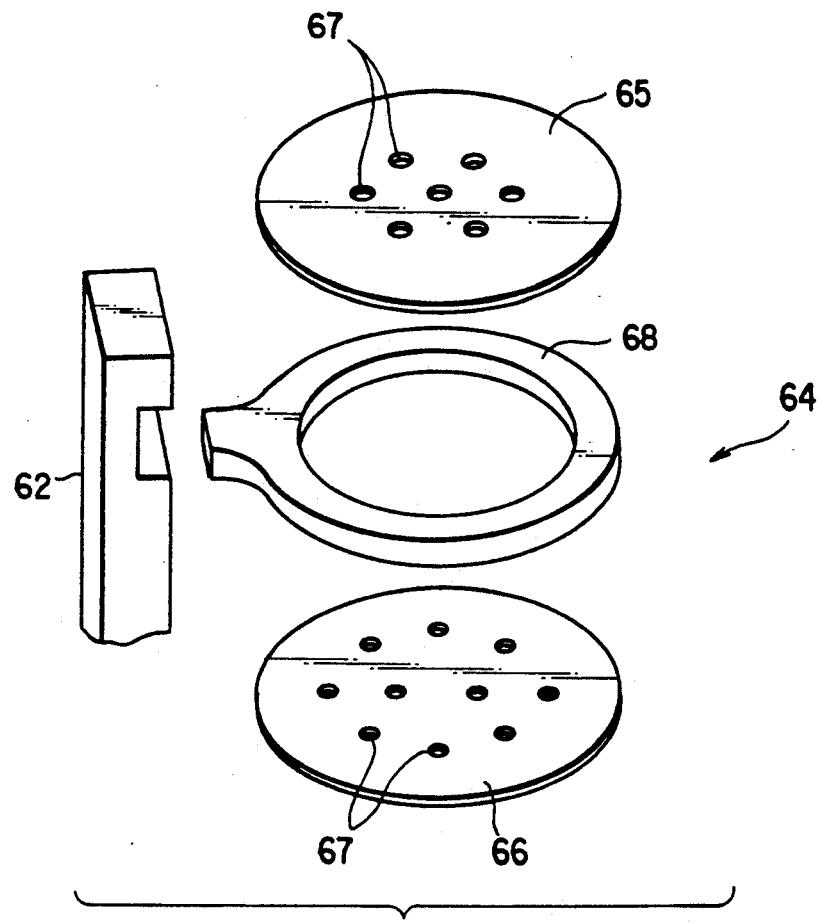
FIG. 7 is an exploded perspective view of the heat insulation member.

Heat insulation means, such as a heat insulation member 64, is provided between the first fork 17 and the second or middle fork 18. The member 64 is located in a stand-by position or initial position on the transportation base 14a for the first and second forks. As shown in FIGS. 6 and 7, the heat insulation member 64 is composed of a ring-shaped aluminum frame 68 and two heat insulator plates 65 and 66 of engineering plastics covering the top and bottom faces, respectively, of the frame 68. The effect of heat insulation can be heightened by using a plate member having a narrow planar space kept at a vacuum, such as an airtight glass vessel, as another example of the heat insulation means.

The proximal portion of the frame 68 is fixedly attached to a mounting member 62, which is fixed to the transportation base 14a. The heat insulator plates 65 and 66 are formed with a plurality of vent holes 67 having a diameter of, e.g., about 20 mm, preferably from 10 mm to 30 mm, so that the down flow F in the clean room can be circulated without disturbance. In this case, the vent holes 67 of the upper and lower insulator plates 65 and 66 are staggered lest they overlap one another with respect to the vertical direction, in order to heighten the effect of heat insulation.

Figure 4:
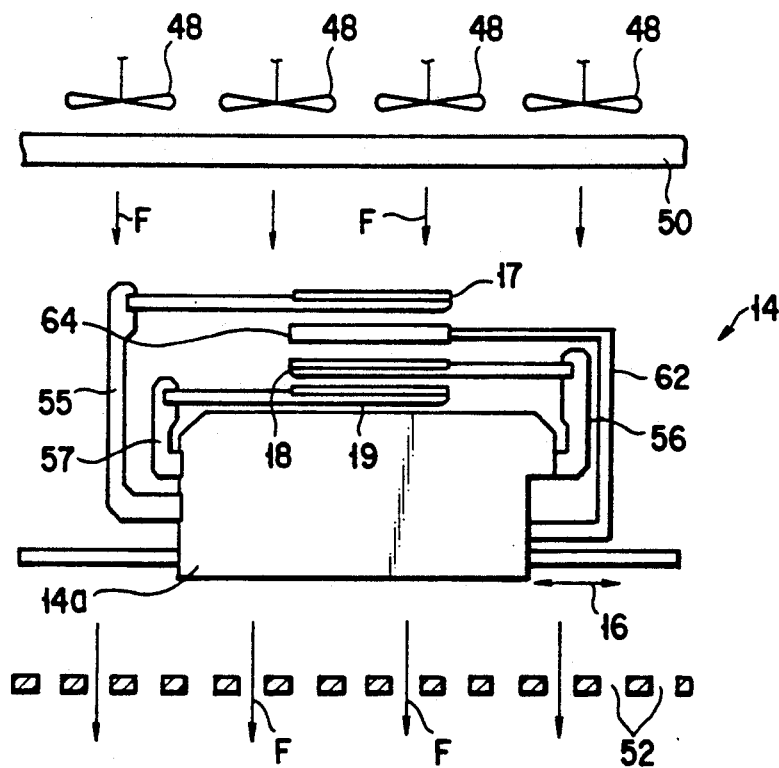
FIG. 4 is a schematic side view showing the relationship between a transportation mechanism according to a modification of the first embodiment and the down flow in the clean room.

As shown in FIG. 4, moreover, the apparatus according to this modification is provided with the fans 48 and the filter 50 at the top portion, in order to produce the down flow F of clean air. Also, the air suction ports 52 for introducing and discharging the clean air are arranged at the bottom portion of the apparatus. The down flow F used may be the one produced in the clean room in which the apparatus is installed.

In a process for forming a photoresist film on the surface of each wafer 2 according to the present modification, the transportation of the wafer 2 from the cooling mechanism 22 to the applicator mechanism 23 or 24 is carried out by means of the first fork 17 previously designed for exclusive use, and the first fork 17 is not used for the transportation of those wafers 2 heated by means of the baking mechanism 21. When those wafers 2 whose temperature is adjusted to, for example, normal temperature by means of the cooling mechanism 22 are transported, therefore, the wafer temperature cannot be increased by heat from the fork 17.

Further, the heat insulation member 64 is interposed between the first and second forks 17 and 18, and the down flow F is produced. Accordingly, the temperature of the wafer 2 on the first fork 17 cannot be raised by heat from the high-temperature wafers 2 heat-treated by means of the baking mechanism 21 or from the second forks 18 and 19 used for the transportation of these wafers 2 and heated thereby.

As shown in FIG. 6, much of upward radiation (heat rays) R from the high-temperature wafers 2 or the second forks 18 and 19 is intercepted by the lower heat insulator plate 66 formed of, e.g., heat insulating acrylic resin or ceramics. Some of the radiation R passes through the vent holes 67 of the lower insulator plate 66. Since the vent holes 67 of the upper and lower insulator plates 65 and 66 are staggered lest they overlap one another with respect to the vertical direction, however, the radiation R having passed through the vent holes 67 of the lower plate 66 is intercepted by the upper plate 65, and is prevented from being applied the wafer 2 on the first fork 17.

Since the upper and lower heat insulator plates 65 and 66 have the vent holes 67, moreover, the down flow F gets into the space between the plates 65 and 66 through the holes 67 thereof. Accordingly, a heat convection produced by the high-temperature wafers 2 or the second forks 18 and 19 cannot be directed to the wafer 2 on the first fork 17, and heat transfer through air can be prevented.

Since the down flow F passes through the inside of the heat insulation member 64, moreover, heat of the member 64 can be radiated by means of the down flow F, thus ensuring good heat insulating properties. Since the down flow F of clean air passes through the heat insulation member 64, furthermore, the forks 17, 18 and 19 and their surroundings can be kept clean and cooled.

Thus, the wafers 2 adjusted in temperature by means of the cooling mechanism 22 can be carried into the applicator mechanisms 23 and 24 without substantially changing their temperatures. Therefore, variations in thickness, which is attributable to temperature differences, can be eliminated during the application processes of the applicator mechanisms 23 and 24, so that the resist film can be uniformly formed on the wafers 2 with high accuracy.

In this modification, moreover, the wafers 2 are carried in and out by means of a plurality of forks 17, 18 and 19, and a plurality of wafers 2 are simultaneously treated in parallel with one another by means of the treatment mechanisms 20 to 24. Thus, the throughput (per unit time) of the wafers 2 can be improved.

Although the two heat insulator plates 65 and 66 are used in the heat insulation member according to the modification described above, another heat insulator plate may be additionally used to constitute a triplicate structure. Instead of forming the vent holes 67 in the insulator plates 65 and 66, moreover, a dog-legged or S-shaped down flow passage may be formed in the heat insulation member. To heighten the effect of heat radiation of the heat insulation member 64, furthermore, the lower surface of the insulator plate 66 may be plated.

Although the resist film forming apparatus has been described in connection with the first embodiment and the modification thereof, the present invention is not limited to these arrangements, and may be also applied to any other suitable treatment apparatuses, such as a developing apparatus. More specifically, the transportation-transfer device of the invention may be applied to any system in which an object of treatment is transported to a plurality of treatment mechanisms of different treatment temperatures. If the applicator mechanism 24 is a developer applicator mechanism, the applicable treatment apparatus can be used as a resist coating-developing apparatus.

Although the treatment of the semiconductor wafers has been described in connection with the first embodiment and the modification thereof, furthermore, the present invention may be applied to any other platelike objects of treatment, such as LCD substrates, printed boards, photomasks, etc.

The following is a description of a second embodiment of the present invention.

Figure 9:
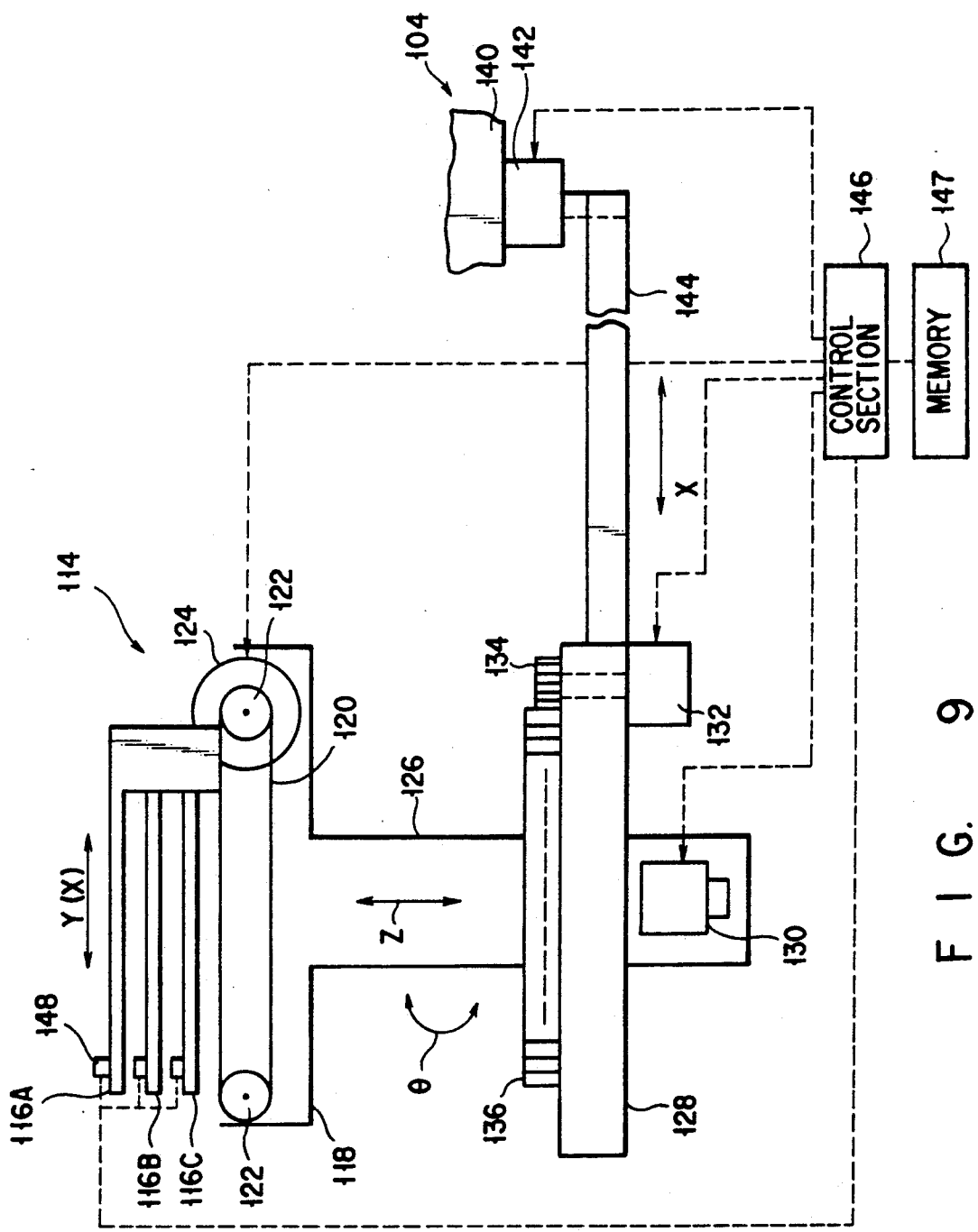
FIG. 9 is a diagram showing an arrangement of a control section of the transportation-transfer device according to the second embodiment.

FIG. 8 shows a resist film forming apparatus according to the second embodiment, and FIG. 9 shows a transportation device used in the resist film forming apparatus.

The resist film forming apparatus 102 comprises a treatment section 104 and a loader section 106 which are arranged individually in the horizontal direction (X direction of FIG. 8) and connected to each other. In some cases, an interface section (not shown) including a transportation mechanism may be provided on one side of the treatment section 104. This transportation mechanism is used to deliver semiconductor wafers as objects of treatment to and from, for example, an exposure machine.

The treatment section 104 has a box-shaped general configuration, combining treatment units 108A to 108E for subjecting the objects of treatment, e.g., semiconductor wafers 2, to a series of treatments by photolithography, and a transportation mechanism 110 for transporting and carrying out the wafers 2 to the units 108A to 108E.

More specifically, the transportation mechanism 110 is located in the central portion of the box-shaped treatment section 104, extending in the longitudinal direction thereof. The treatment unit 108A for resist coating and the treatment unit 108B for developing are arranged on one side of the transportation mechanism 110, while the treatment unit 108C for hydrophobic treatment of the wafer surface, treatment unit 108D for pre-baking, and treatment unit 108E for cooling are successively arranged side by side on the other side. If necessary, the treatment units 108C to 108E may be stacked in layers in a suitable combination.

The transportation mechanism 110 is composed mainly of guide rails 112 arranged in the central portion of the treatment section 104, so as to extend in the longitudinal direction thereof, and a transportation unit 114 movable along the rails 112. As is also shown in FIG. 9, the transportation mechanism 110 is provided with, for example, three wafer forks 116A, 116B and 116C on a base 118, in order to support the wafers 2. The forks 116A, 116B and 116C are attached individually to independent fork belts 120 which are passed around and between two pulleys 122. One of the pulleys 122 is provided with fork drive sources 124, e.g., stepping motors, so that the individual wafer forks can be independently moved in the longitudinal direction (X direction) thereof as the drive sources 124 are rotated in the forward and reverse directions. FIG. 9 shows only one combination of the fork belt 120 and the drive source 124 for simplicity of illustration.

Each of the wafer forks 116A, 116B and 116C has a distal end portion in the form of, for example, a circular arc, and is designed so as to support the peripheral edge portion of the underside of the wafer 2.

The base 118 is supported on the upper end portion of a leg 126 which protrudes downward therefrom, and the lower portion of the leg 126 is supported on a frame 128 so as to be movable in the vertical direction or Z direction by means of a ball screw (not shown) and the like. A Z-direction drive source 130, e.g., a servomotor, is provided at the lower end portion of the leg 126, whereby the leg 126 can be moved in the Z direction.

The frame 128 is provided with a $\theta$-direction drive source 132, e.g., a stepping motor, and a small gear 134 is mounted on the shaft of the drive source 132. The small gear 134 is in mesh with a large gear 136 mounted on the leg 126 so that the leg 126 can be rotated about its axis, that is, in the $\theta$ direction, by driving the $\theta$-direction drive source 132. The gears 134 and 136 may alternatively be connected by means of a belt.

Further, the frame 128 is connected to an X-direction drive source 142, e.g., a servomotor, which is mounted on a fixed frame 140 of the treatment section 104, by means of a long belt 144. The transportation unit 114 can be moved in the X direction by driving the drive source 142. Thus, the wafer forks 116A, 116B and 116C are movable in the X, Y, Z, and $\theta$ directions.

Figure 10:
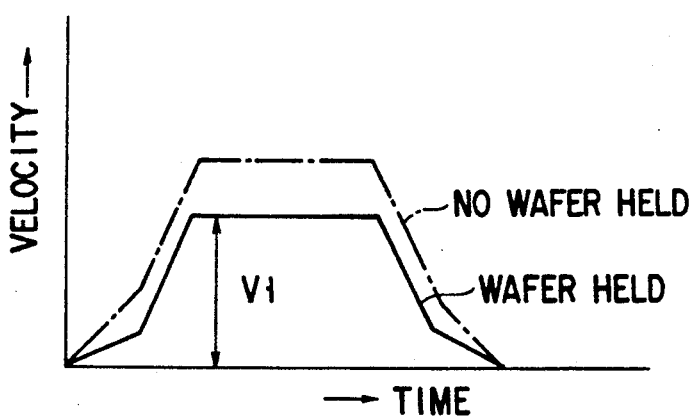
FIGS. 10, 11 and 12 are graphs individually showing time-velocity relationships indicative of operation modes of the transportation device according to the second embodiment.
Figure 11:
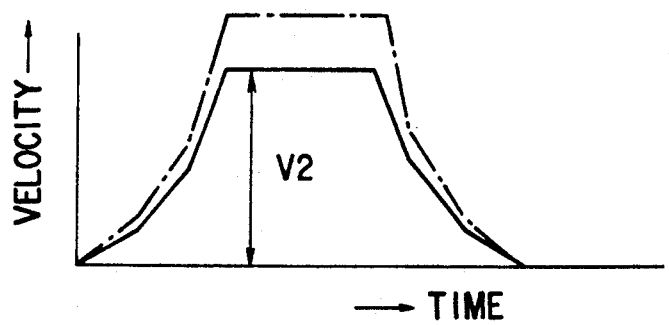
Figure 12:
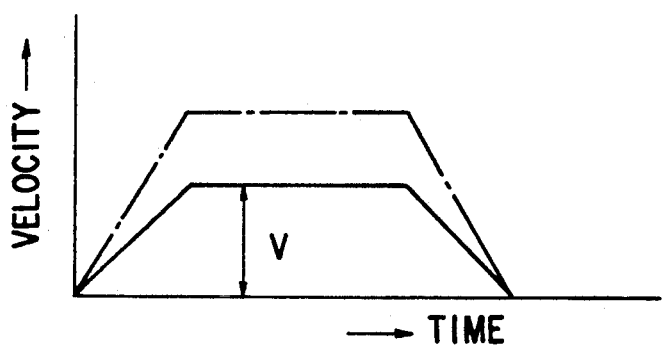

The drive sources 124, 130, 132 and 142 are connected electrically to a control section 146, which includes a CPU, so that they can operate in response to commands from the control section. The control section 146 is connected with a memory 147 which can be programmed in advance. In this case, operation modes of the transportation unit 114, previously loaded in the memory 147, can be set in the form of velocity characteristic curves, as shown in FIGS. 10, 11 and 12, for example. The operation modes can be designed so that the acceleration varies during acceleration and deceleration periods, as shown in FIGS. 10 and 11, or that the maximum attainable velocity is changed by varying the acceleration during the acceleration and deceleration periods, depending on whether the wafers are held or not, as shown in FIG. 12. The presence of the wafers is discriminated in accordance with sequence programs for controlling the whole apparatus. Each wafer fork may be provided with a sensor 148 so that the presence of the wafers can be discriminated by a signal from the sensor 148 entered in the control section 146.

In the loader section 106 adjacent to the treatment section 104, a plurality of cassette mounting sections 152, e.g., four in number, are arranged side by side along the transverse direction of the treatment section 104. Each cassette mounting section 152 is mounted with a wafer cassette 150, which can store, e.g., 25 wafers 2, and can move the cassette in the vertical direction (Z direction).

The loader section 106 is provided with a loader section transportation unit 156 movable on a rail 154 which extends along the cassette mounting sections 152. Thus, the wafers 2 can be delivered between the wafer cassettes 150 and the transportation unit 114.

More specifically, the loader section transportation unit 156 includes an arm 158 for holding the wafer 2 and a plurality of stage pins 160 for supporting the wafer on their respective upper end portions. The pins 160 can be moved up and down by means of a drive source (not shown), such as a stepping motor or servomotor, and a ball screw. The arm 158 can be moved toward the wafer cassettes, that is, in the X and Z directions, by means of a plurality of drive sources, such as servomotors. Also, the loader section transportation unit 156 can be moved in the longitudinal direction of the rail 154, that is, in the Y direction, by means of servomotors (not shown).

The individual drive sources for activating the loader section transportation unit 156 are connected electrically to a control section, which is similar to the control section 146, and are driven in the same operation modes as are described before with reference to FIGS. 10 to 12.

The following is a description of the resist film forming apparatus according to the second embodiment constructed in this manner.

First, the wafer cassettes 150, stored with the semiconductor wafers 2, are set individually on the cassette mounting sections 152 by means of a robot, e.g., a handling arm. Thenceforth, the loader section transportation unit 156 and the transportation unit 114 are driven in the operation mode shown in FIG. 10 or 11. When the cassette setting is completed in this manner, the unit 156 is moved in the Y direction along the rail 154, and is stopped at a position where it faces the desired wafer cassette 150

Subsequently, the arm 158 stretches toward the cassette, that is, in the X direction, to be inserted under the desired wafer 2. In this state, the arm 158 is moved upward, that is, in the Z direction, so that the underside of the wafer 2 is held by means of the arm 158.

Then, the arm 158, supporting the wafer 2 thereon, is moved in the X direction, and the wafer 2 is drawn out of the wafer cassette 150.

Thereafter, the loader section transportation unit 156 is moved in the Y direction along the rail 154, and is stopped at the central portion. Then, the stage pins 160 are raised to lift the wafer 2 slightly.

In this state, the X-direction drive source 142 of the transportation unit 114 of the treatment section 104 is driven to move one of the three wafer forks 116A, 116B and 116C in the longitudinal direction thereof or in the X direction, thereby stretching it, and causes, for example, the fork 116A to cross the stage pins 160 so as to pass between the pins under the wafer 2. As the stage pins 160 are lowered, the wafer 2 transferred to the wafer fork 116A of the transportation unit 114. In doing this, the Z-direction drive source 130 of the transportation unit 114 is driven to vertically move the leg 126 as required, whereby the respective heights of the fork 116A and the wafer 2 to be delivered thereto are adjusted beforehand.

When the delivery of the wafer 2 is completed in this manner, the X-direction drive source 142 is driven to restore the wafer fork 116A holding the wafer 2 to its original position. Thereafter, the wafer 2 is transported to the specific treatment units 108A to 108C in succession, whereupon it is subjected to the specific treatments.

First, in order to carry out the hydrophobic treatment, the X-direction drive source 142 is driven to move the transportation unit 114 in the X direction, and to situate the unit 114 in the location of the hydrophobic treatment unit 108C.

As the transportation unit 114 is moved in the direction, or on completion of the movement in the X direction, the $\theta$-direction drive source 132 is driven to rotate the leg 126 through 90°, whereby the wafer fork 116 is opposed to the hydrophobic treatment unit 108C and stopped.

Then, the Z-direction drive source 130 is driven to move the leg 126 vertically or in the Z direction, thereby adjusting the respective heights of the wafer 2 to be treated and the hydrophobic treatment unit 108C so that they are on the same level.

When this height adjustment is completed, the fork drive source 124 is driven to stretch the wafer fork 116A, which holds the wafer 2, and move it in the Y direction, whereby the wafer 2 is introduced into the hydrophobic treatment unit 108C to be set therein. After the unloaded wafer fork 116A is restored to its original position, the hydrophobic treatment is executed.

When the hydrophobic treatment is finished in this manner, the X-, Y-, Z- and $\theta$-direction drive sources 142, 124, 130 and 132 are driven in a suitable combination to transport the wafer 2 to the treatment unit 108A for resist coating, developer treatment unit 108B, etc. in succession, whereupon the wafer 2 is subjected to the specific treatments in a predetermined order.

After undergoing all the treatments, the treated wafer 2 is delivered from the transportation unit 114 of the treatment section 104 to the loader section transportation unit 156, reversely following the aforementioned steps of procedure, and is finally stored in the desired wafer cassette 150.

When all the wafers 2 in the wafer cassette 150 are treated by repeating the aforesaid series of operations, the cassette 150 is carried out, and a new wafer cassette is carried in.

Since the loader section transportation unit 156 and the individual drive sources of the transportation unit 114 of the treatment section 104 are driven in the operation mode shown in FIGS. 10 or 11 by means of the control section 146, the maximum velocity attainable without entailing misadjustment is higher than in the conventional case, and the throughput can be improved correspondingly.

In the operation mode shown in FIG. 10, the acceleration is changed once during the acceleration and deceleration periods of the drive sources 124, 130, 132 and 142. The acceleration is high at the start of movement, and is switched to a higher level in the middle, so that a maximum attainable velocity V1 higher than the conventional maximum attainable velocity V can be reached in a fixed period of time. By thus switching the acceleration in stages, the maximum velocity which can be attained without entailing misadjustment of the motor or shaking of the wafer attributable to rapid acceleration can be increased. Further, the throughput can be improved by speeding up the wafer transportation.

At the start of deceleration, the individual drive sources are rapidly decelerated with a high negative acceleration. After they are decelerated to a certain degree, the acceleration is switched to a lower level so that the drive sources are smoothly stopped. Even during the deceleration, misadjustment of the motor and shaking of the wafer can be prevented by this operation.

As described above, the operation mode shown in FIG. 10 is a two-stage mode in which the acceleration is changed once during each of the acceleration and deceleration periods. Alternatively, however, the acceleration may be controlled in a three-stage mode such that it is changed twice during each of the acceleration and deceleration periods, as shown in FIG. 11, for example. In this case, the acceleration is increased in stages or continuously with the passage of time during the acceleration period, and a backward operation is performed during the deceleration period. This arrangement is particularly effective when the movement stroke is long.

In the embodiment described above, the drive sources are driven in the same operation mode, whether the wafers are held or not. Alternatively, however, the maximum attainable velocity may be somewhat lowered by transporting the wafers with acceleration and deceleration low enough to avoid misadjustment when the wafers are held, as indicated by full lines in FIGS. 10 to 12. When the wafers are not held, in this case, the maximum attainable velocity is increased by rapid acceleration and rapid deceleration without entailing misadjustment, as indicated by dashed lines in FIGS. 10 to 12. More specifically, when the wafers are held, the total mass increases, so that the possibility of misadjustment increases, and the wafers are liable to shake on the wafer forks. Therefore, rapid acceleration and rapid deceleration cannot be effected, so that the maximum attainable velocity is adjusted to a relatively low level by using low acceleration and low deceleration.

Thus, the throughput can be further improved without causing the wafers to be damaged by impact during the acceleration, by subjecting the drive sources to rapid acceleration and rapid deceleration when the wafers are not held, and to low acceleration and low deceleration when the wafers are held. Accordingly to this arrangement, one cycle of transportation requires only 6 seconds, for example, as compared with 8 seconds required in the conventional case. In this manner, the throughput can be considerably improved.

In changing the maximum attainable velocity depending on whether the wafers are held or not, the present invention may be applied not only to the case in which the acceleration is changed in stages, as shown in FIGS. 10 and 11, but also to the conventional case in which the acceleration is not changed during the acceleration and deceleration periods, as shown in FIG. 12.

Further, the operation modes are not limited to the ones shown in FIGS. 10 to 12, and the illustrated characteristic curves may be combined as required. The operation mode can be easily changed to the operation of the control section 146 by modifying the programs to be previously entered in the memory 147.

According to the embodiment described above, moreover, the present invention is applied to the loader section transportation unit 156 and the transportation unit 114 of the treatment section 104. If the treatment apparatus 102 comprises other transportation units than these transportation units, however, the invention may be also applied to the alternative units to improve the throughput.

Naturally, furthermore, the treatment units are not limited to the ones described herein, and the present invention may be also applied to any other combinations of the treatment units for the treatment apparatus 102.

Further, the objects of treatment to be transported may include glass plates, LCD substrates, etc., as well as the semiconductor wafers.

It is to be understood that the present invention is not limited to the embodiments and modifications described above, and that various changes and modifications may be effected therein by one skilled in the art without departing from the scope or spirit of the invention.

What is claimed is:

1. A device for transporting and transferring objects to be treated arranged in a down flow to a plurality of treatment sections for treating the objects, comprising:

a transportation section movable between the treatment sections;

first drive means for moving the transportation section;

a first arm movably attached to the transportation section and used for those objects to be treated which are adjusted to a predetermined temperature in the treatment sections;

a second arm movably attached to the transportation section and used for the other objects to be treated than the ones adjusted in temperature;

second drive means for separately moving the first and second arms; and heat insulation means arranged between the first and second arms, the heat insulation means being provided to face the first and second arms for preventing a transmission of radiation heat from an object supported by the second arm to an object supported by the first arm;

wherein said first arm is located on the upper-course side of the second arm with respect to the down flow.

2. A device for transporting and transferring objects to be treated arranged in a down flow to a plurality of treatment sections for treating the objects, comprising:
a transportation section movable between the treatment sections;
first drive means for moving the transportation section;
a first arm movably attached to the transportation section and used for those objects to be treated which are adjusted to a predetermined temperature in the treatment sections;
a second arm movably attached to the transportation section and used for the other objects to be treated than the ones adjusted in temperature;
second drive means for separately moving the first and second arms; and
heat insulation means arranged between the first and second arms;
wherein said heat insulation means includes a ring-shaped frame and two heat insulator plates attached individually to the opposite surfaces of the frame.

3. A device for transporting and transferring objects to be treated arranged in a down flow to a plurality of treatment sections for treating the objects, comprising:
a transportation section movable between the treatment sections;
first drive means for moving the transportation section;
a first arm movably attached to the transportation section and used for those objects to be treated which are adjusted to a predetermined temperature in the treatment sections;
a second arm movably attached to the transportation section and used for the other objects to be treated than the ones adjusted in temperature;
second drive means for separately moving the first and second arms; and
heat insulation means arranged between the first and second arms;
wherein said heating insulation means has passages through which the down flow passes.

4. A transportation-transfer device according to claim 3, wherein said passages include holes, each having a diameter of 10 mm to 30 mm.

5. A transportation-transfer device according to claim 1, further comprising control means for controlling the first and second drive means.

6. A transportation-transfer device according to claim 5, wherein said control means includes means for varying the acceleration of at least one of the transportation section, first arm, and second arm during at least one of an acceleration and deceleration period for the movement thereof.

7. A transportation-transfer device according to claim 6, wherein said control means includes means for varying the acceleration in two stages.

8. A transportation-transfer device according to claim 5, wherein said control means includes means for changing the movement mode of at least one of the transportation unit, first arm, and second arm, depending on whether or not the objects are held by means of the arms.

9. A transportation-transfer device according to claim 8, wherein said movement mode changing means includes a memory connected to the control means.

10. A transportation-transfer device according to claim 8, wherein said movement mode changing means includes sensing means for detecting the objects held by means of the arms.

* * * * *